United States Patent
Kasa

(10) Patent No.: US 10,325,857 B2
(45) Date of Patent: Jun. 18, 2019

(54) SEMICONDUCTOR DEVICE MANUFACTURING METHOD AND SEMICONDUCTOR WAFER

(71) Applicant: Toshiba Memory Corporation, Minato-ku (JP)

(72) Inventor: Kentaro Kasa, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/901,437

(22) Filed: Feb. 21, 2018

(65) Prior Publication Data

US 2019/0081005 A1  Mar. 14, 2019

(30) Foreign Application Priority Data

Sep. 14, 2017  (JP) .................. 2017-176879

(51) Int. Cl.
  *H01L 23/544* (2006.01)
  *H01L 21/027* (2006.01)
  *H01L 21/311* (2006.01)

(52) U.S. Cl.
  CPC ........ *H01L 23/544* (2013.01); *H01L 21/0274* (2013.01); *H01L 21/31116* (2013.01); *H01L 21/31144* (2013.01); *H01L 2223/54426* (2013.01)

(58) Field of Classification Search
  CPC ............ H01L 23/544; H01L 21/31116; H01L 21/31144; H01L 21/0274; H01L 2223/54426
  See application file for complete search history.

(56) References Cited

U.S. PATENT DOCUMENTS

| 5,702,567 A | 12/1997 | Mitsui et al. |
| 5,917,205 A | 6/1999 | Mitsui et al. |
| 8,790,851 B2 | 7/2014 | Okamoto et al. |
| 9,117,775 B2 | 8/2015 | Aton et al. |
| 9,599,887 B2 | 3/2017 | Nam |
| 9,612,526 B2 | 4/2017 | Lin et al. |
| 2018/0218951 A1* | 8/2018 | Izawa ............... H01L 22/20 |

FOREIGN PATENT DOCUMENTS

| JP | 64-25411 | 1/1989 |
| JP | 10-213895 | 8/1998 |
| JP | 2002-64055 | 2/2002 |
| JP | 3343026 | 11/2002 |
| JP | 2013-195912 | 9/2013 |

* cited by examiner

*Primary Examiner* — Hoa B Trinh
(74) *Attorney, Agent, or Firm* — Oblon, McClelland, Maier & Neustadt, L.L.P.

(57) ABSTRACT

According to an embodiment, a first resist pattern that includes a mark including a second pattern provided with first components and a third pattern not provided with the first components is formed. Then, a first recessed area is formed on a processing target layer using the first resist pattern. Thereafter, a second resist pattern that includes a fourth pattern is formed. The fourth pattern is formed such that the third pattern and part of the second pattern, which includes at least one row of the first components arranged along a periphery of the third pattern, are exposed. Then, a second recessed area is formed by using the second resist pattern. Thereafter, a position of the processing target layer is recognized by using a stepped portion formed at the second recessed area, in a light exposure apparatus, and a third resist pattern is formed.

4 Claims, 23 Drawing Sheets

SEMICONDUCTOR DEVICE MANUFACTURING METHOD AND SEMICONDUCTOR WAFER

CROSS-REFERENCE TO RELATED APPLICATIONS

This application is based upon and claims the benefit of priority front Japanese Patent Application No. 2017-176879, filed on Sep. 14, 2017; the entire contents of which are incorporated herein by reference.

FIELD

An embodiment described herein relates generally to a semiconductor device manufacturing method and a semiconductor wafer.

BACKGROUND

A circuit original plate (which will be referred to as "reticle", hereinafter) to be used for a lithography process includes a pattern arrangement region having a rectangular shape, and a mark arrangement region having a frame-like shape provided at the peripheral side of the pattern arrangement region. The pattern arrangement region is provided with a circuit pattern for forming a device pattern by light exposure. The mark arrangement region is provided with marks, such as an alignment mark and an overlay measurement mark. Along with the progress of scaling of semiconductor devices, circuit patterns have been downsized. However, the marks need to be optically monitored, and thus the size of the marks is set larger than that of the circuit pattern. Accordingly, there is a case where an overlay error between a mark and the circuit pattern is improper, because of an influence of the aberration of a lens for projecting the reticle in a reduced state.

BRIEF DESCRIPTION OF THE DRAWINGS

FIGS. 5A to 5H;

DETAILED DESCRIPTION

In general, according to one embodiment, at first, a first resist pattern that includes a first pattern including first components, and a mark including a second pattern provided with the first components and a third pattern not provided with the first components is formed. The first pattern is arranged to be formed in a device region of a processing target layer, and the mark is arranged to correspond to a kerf region of the processing target layer. Then, a first recessed area is formed on the processing target layer, through the first resist pattern serving as a mask. Thereafter, a first film is embedded into the first recessed area. Then, a second resist pattern that includes a fourth pattern arranged to correspond to the kerf region is formed. The fourth pattern is formed such that the third pattern and part of the second pattern, which includes at least one row of the first components arranged along a periphery of the third pattern, are exposed. Then, a second recessed area is formed by etching the processing target layer, through the second resist pattern serving as a mask, under conditions in which the first film is hardly etched with respect to the processing target layer in the kerf region. Then, a second film is formed on the processing target layer. A resist is applied onto the processing target layer. Thereafter, a position of the processing target layer is recognized by using a stepped portion formed at the second recessed area of the mark, in a light exposure apparatus. Then, a third resist pattern is formed by performing light exposure process to the resist by using a reticle.

An exemplary embodiment of a semiconductor device manufacturing method and a semiconductor wafer will be explained below in detail with reference to the accompanying drawings. The present invention is not limited to the following embodiment. The sectional views of a semiconductor device used in the following embodiment are schematic, and so the relationship between the thickness and width of each layer and/or the thickness ratios between respective layers may be different from actual states. Further, the film thicknesses shown hereinafter are mere examples, and they are not limiting.

Figure 1:
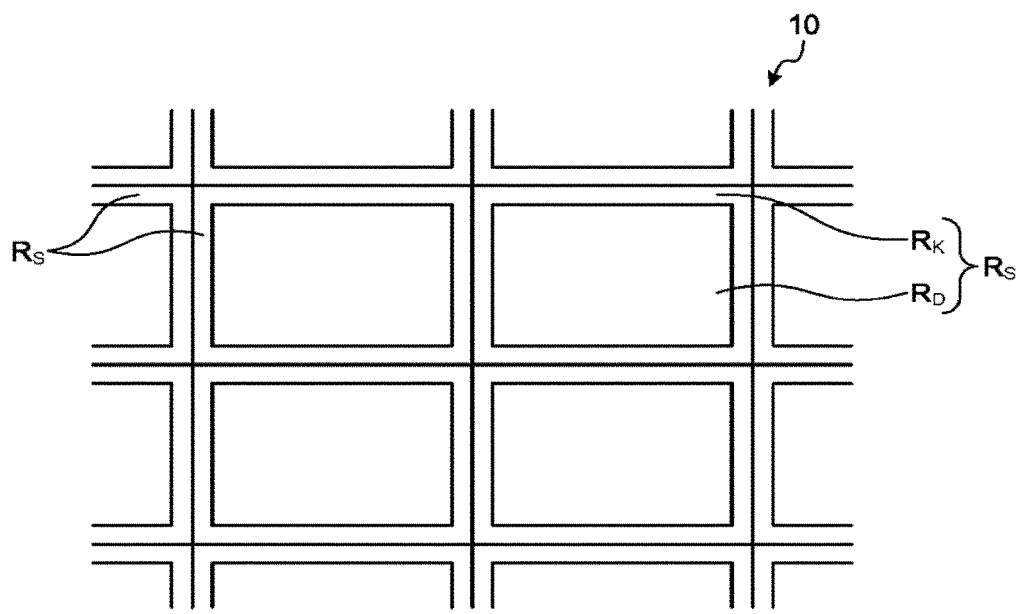
FIG. 1 is a partial top view illustrating configuration example of shot regions of a semiconductor wafer.

Hereinafter, an explanation will take as an example a case for forming marks onto a semiconductor wafer provided with a processing target film. FIG. 1 is a partial top view illustrating a configuration example of shot regions of a semiconductor wafer. The semiconductor wafer 10 includes a plurality of shot regions $R_S$. Each of the shot regions $R_S$ includes a kerf region $R_K$ that is a frame-like region at the peripheral side of each shot region $R_S$, and a rectangular device region $R_D$ inside the kerf region $R_K$. The device region $R_D$ is provided with a device pattern including devices and wiring lines. The device pattern is obtained by working a semiconductor wafer 10 treated as a processing object, or a processing target layer on the semiconductor wafer 10. The kerf region $R_K$ is provided with marks, such as an alignment mark and an overlay measurement mark. Here, after the process to the respective shot regions $R_S$ of the semiconductor wafer 10 is completed, the semiconductor wafer 10 is cut into chips by dicing along the kerf regions $R_K$.

Figure 2:
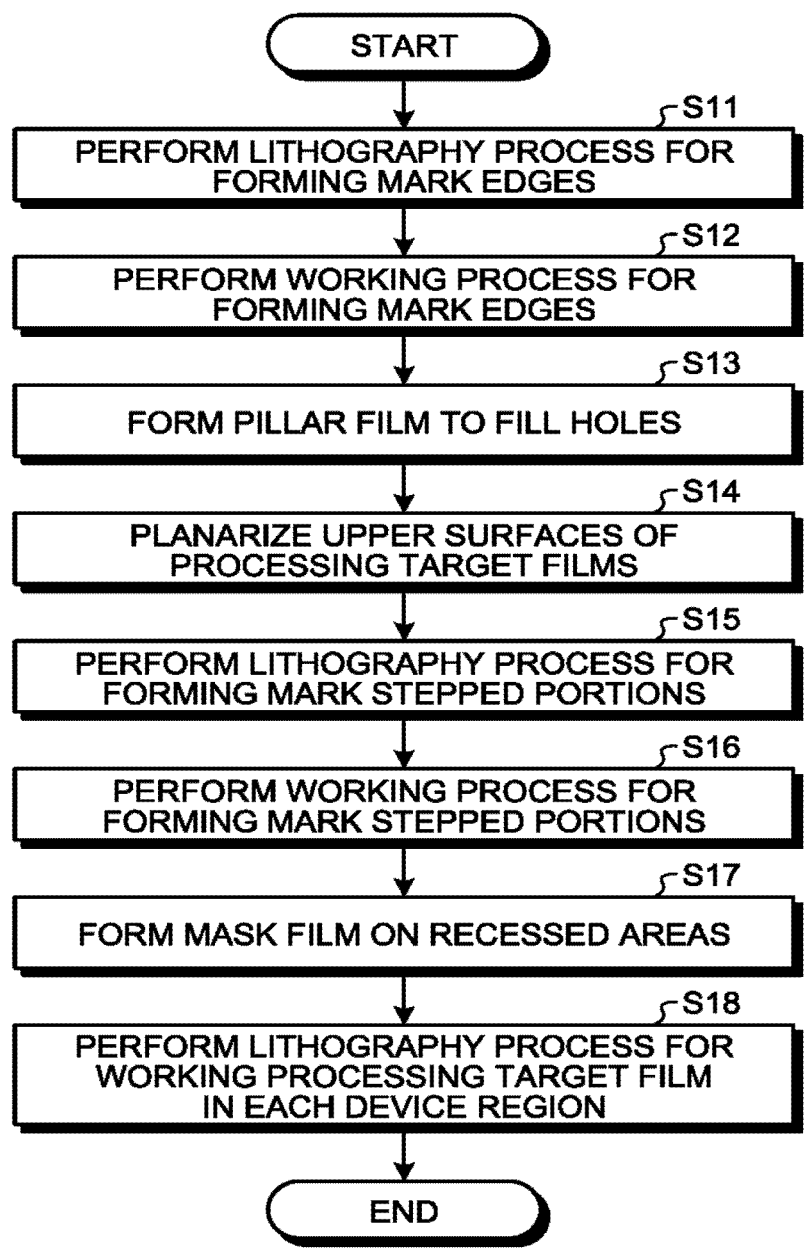
FIG. 2 is a flowchart illustrating an example of the sequence of a semiconductor device manufacturing method according to an embodiment.

FIG. 2 is a flowchart illustrating an example of the sequence of a semiconductor device manufacturing method according to an embodiment. FIGS. 3A to 3H are partial top views schematically illustrating the example of the sequence of a semiconductor device manufacturing method in a device region according to the embodiment. FIGS. 4A to 4H are partial sectional views schematically illustrating the example of the sequence of a semiconductor device manufacturing method in the device region according to the embodiment, which are sectional views taken along a line A-A of FIGS. 3A to 3H. FIGS. 5A to 5H are partial top views schematically illustrating the example of the sequence of a semiconductor device manufacturing method at mark arrangement positions in a kerf region according to the embodiment. FIGS. 6A to 6H are enlarged top views illustrating a region MR12 of FIGS. 5A to 5H. FIGS. 7A to 7H are enlarged top views illustrating a region MR13 of FIGS. 5A to 5H. FIGS. 8A to 8H are sectional views schematically illustrating the example of the sequence of a semiconductor device manufacturing method at mark arrangement positions in the kerf region according to the embodiment, which are sectional views taken along a line B-B of Figs. FIGS. 5A to 5H.

Figure 4A:
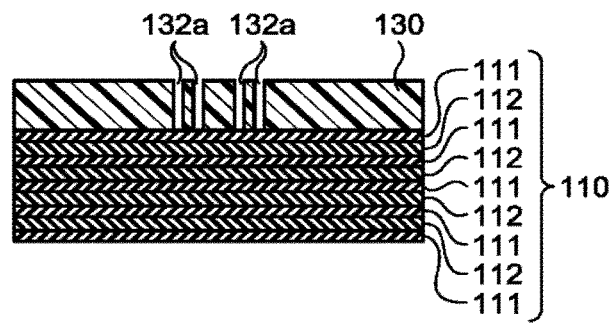
FIGS. 4A to 4H are partial sectional views schematically illustrating the example of the sequence of a semiconductor device manufacturing method in the device region according to the embodiment, which are sectional views taken along a line A-A of FIGS. 3A to 3H.
Figure 6A:
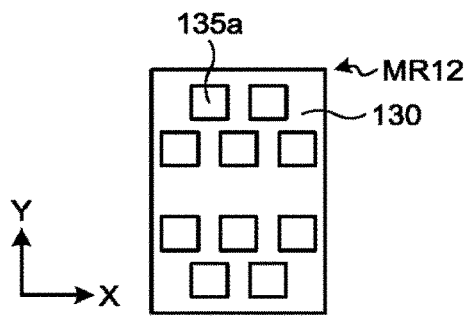
FIGS. 6A to 6H are enlarged top views illustrating a region MR12 of FIGS. 5A to 5H.
Figure 8A:
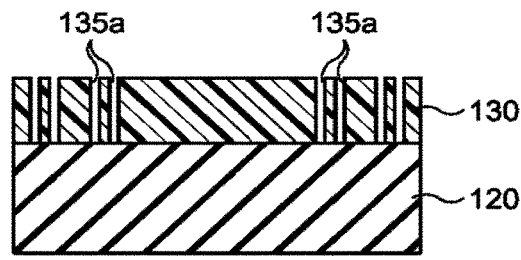
FIGS. 8A to 8H are sectional views schematically illustrating the example of the sequence of a semiconductor device manufacturing method at mark arrangement positions in the kerf region according to the embodiment, which are sectional views taken along a line B-B of Figs.

First, as illustrated in FIG. 4A, a processing target film 110 is formed on each device region $R_D$ of a semiconductor wafer (not illustrated). Here, the processing target film 110 is exemplified by a stacked body formed by alternately stacking a silicon oxide film 111 and a silicon nitride film 112 each as a plurality of layers. This processing target film 110 is to be used for manufacturing a nonvolatile semiconductor storage device having a three-dimensional structure. Further, as illustrated in FIG. 6A, a processing target film 120 is formed above each kerf region $R_K$ of the semiconductor wafer (not illustrated). The processing target film 120 formed above the kerf region $R_K$ may be the same as or different from the processing target film 110 formed above the device region $R_D$. FIG. 8A illustrates a case where the processing target film 120 formed above the kerf region $R_K$ is different from the processing target film 110 formed above the device region $R_D$. The processing target film 120 is a silicon oxide film, for example.

Then, a lithography process for forming mark edges is performed (step S11). Specifically, a resist is applied onto the processing target films 110 and 120. Thereafter, as illustrated in FIGS. 3A, 4A, 5A, and 8A, the resist is subjected to light exposure and then to development, so that a resist pattern 130 is formed on the processing target films 110 and 120.

Figure 9:
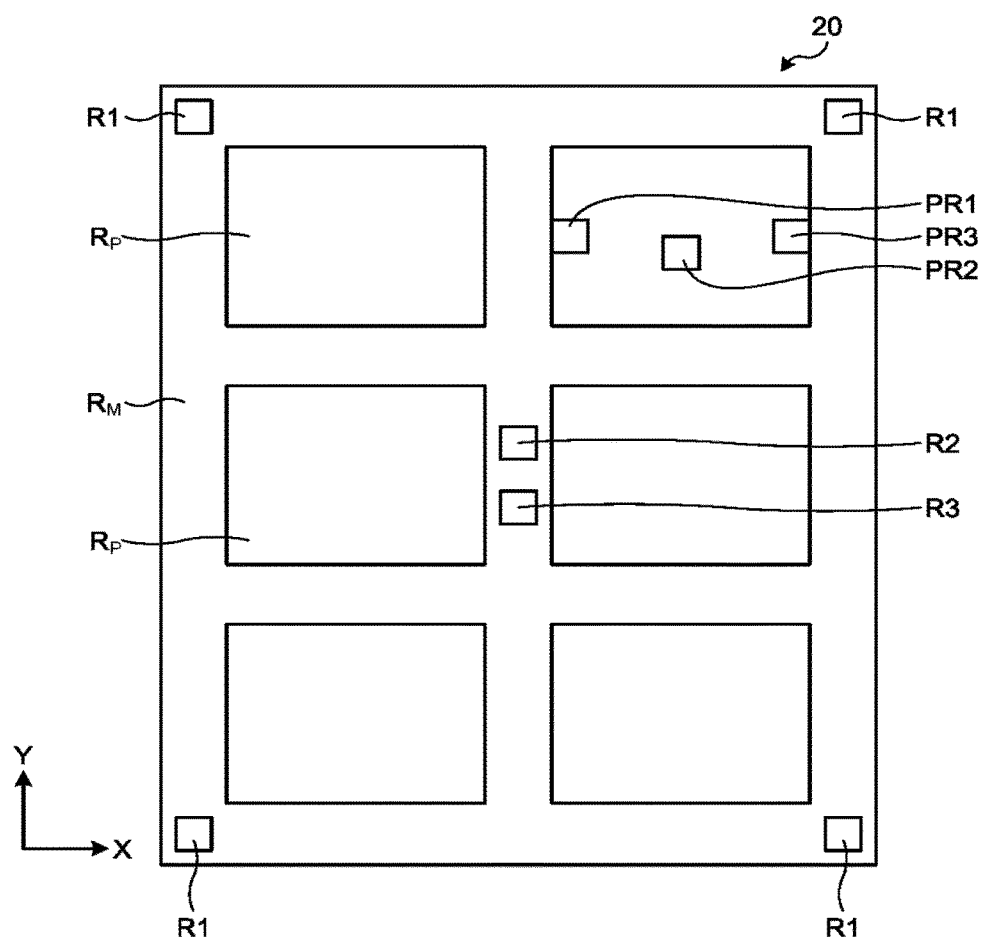
FIG. 9 is a top view schematically illustrating a configuration example of a reticle.

In the light exposure process, a reticle is used. FIG. 9 is a top view schematically illustrating a configuration example of a reticle. The reticle 20 includes pattern arrangement regions $R_P$ each provide with device formation patterns including device, and wiring lines to be formed on the processing target film 110 in each device region $R_D$ and a mark arrangement region $R_M$ provided with marks to be used in the light exposure process.

Figure 10A:
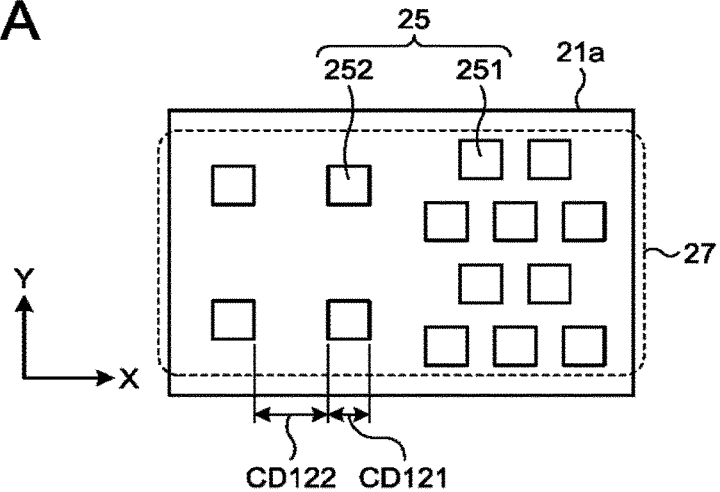
FIGS. 10A to 10C are diagrams illustrating an example of device formation patterns of the reticle.
Figure 10B:
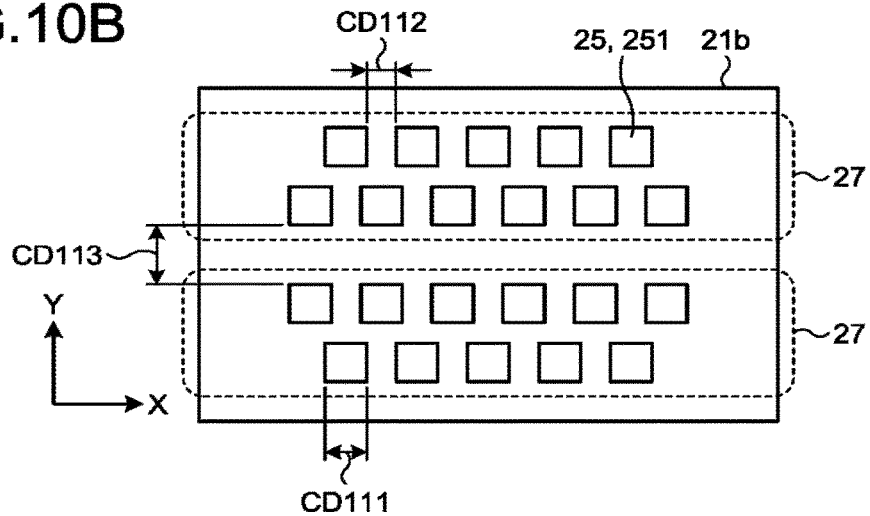
Figure 10C:
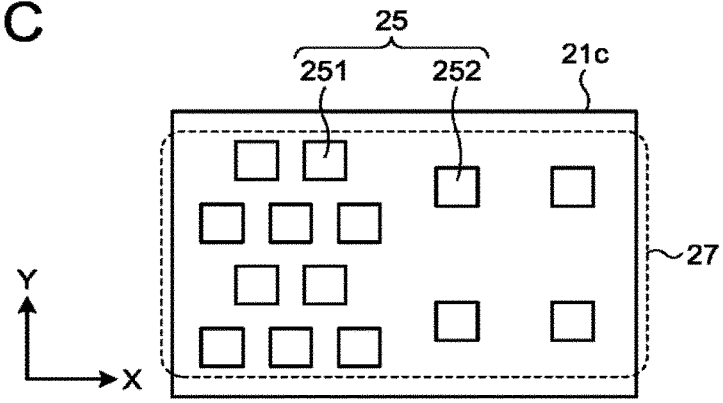

FIGS. 10A to 10C are diagrams illustrating an example of device formation patterns of the reticle. FIG. 10A is a diagram illustrating an example of a device formation pattern at one end in an X-direction. FIG. 10B is a diagram illustrating an example of a device formation pattern at and near the center in the X-direction. FIG. 10C is a diagram illustrating an example of a device formation pattern at the other end in the X-direction. Here, FIG. 10A illustrates a device formation pattern 21a in a region PR1 of FIG. 9. FIG. 10B illustrates a device formation pattern 21b in a region PR2 of FIG. 9. FIG. 10C illustrates a device formation pattern 21c in a region PR3 of FIG. 9. In this example, a case is illustrated where the device formation patterns 21a to 21c are composed of hole patterns for forming holes in the processing target film 110.

As illustrated in FIG. 10E, the part of each pattern arrangement region $R_P$ other than the part near the opposite ends in the X-direction has a configuration in which line patterns 27 extending X-direction are arranged at predetermined intervals in a Y-direction. In other words, a line-and-space pattern is arranged here. Each of the line patterns 27 is composed of a plurality of components 25 having a size smaller than that of the line patterns 27. In this example, the components 25 are a plurality of hole patterns 251 constituting a hole, and the hole patterns 251 are arranged in a zigzag lattice-like state. A light-shading film or absorbing film is present in the part between the line patterns 27 mutually adjacent in the Y-direction. Further, the light-shading film or absorbing film is present in the part around the hole patterns 251 inside the line patterns 27.

The size of each of the hole patterns 251 in the X-direction is expressed by CD111. The distance between the hole patterns 251 mutually adjacent in the X-direction is expressed by CD112. Further, the distance between the line patterns 27 mutually adjacent in the Y-direction is expressed by CD113.

Further, as illustrated in FIGS. 10A and 10C, each of the line patterns 27 includes hole patterns 251 and auxiliary hole patterns 252 as components 25. The auxiliary hole patterns 252 are formed near the mark arrangement region $R_M$. The auxiliary hole patterns 252 are arranged in a tetragonal lattice-like state, for example. The size of each of the auxiliary hole patterns 252 in the X-direction is expressed by CD121. The distance between the auxiliary hole patterns 252 mutually adjacent in the X-direction is expressed by CD122. For example, CD121 may be set larger than CD111. Further, CD122 is set larger than CD112.

As illustrated in FIG. 9, the mark arrangement region $R_M$ includes regions R1, a region R2, and a region R3. Each of the regions R1 is provided with an overlay measurement mark for measuring positional deviations in the X-direction and the Y-direction between the processing target film 120 and the reticle 20. The region R2 is provided with an alignment mark used for positioning between the processing target film 120 and the reticle 20 in the X-direction. The region R3 is provided with an alignment mark used for positioning between the processing target film 120 and the reticle 20 in the Y-direction.

Figure 11A:
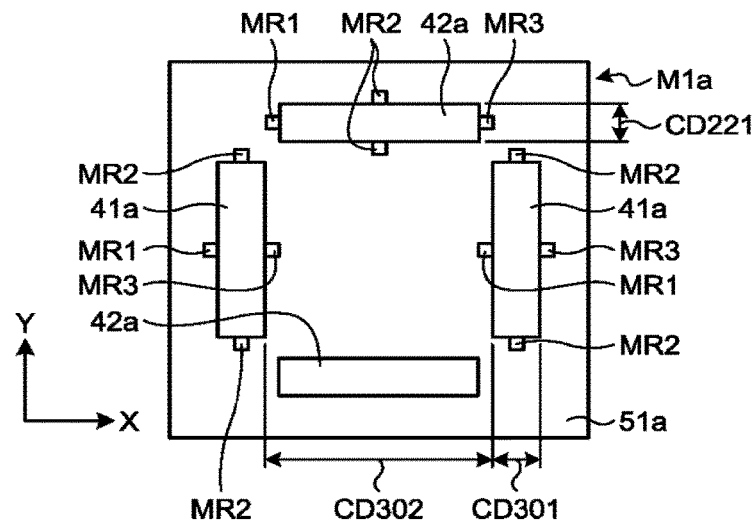
FIGS. 11A to 11C are diagrams illustrating an example of marks.
Figure 11B:
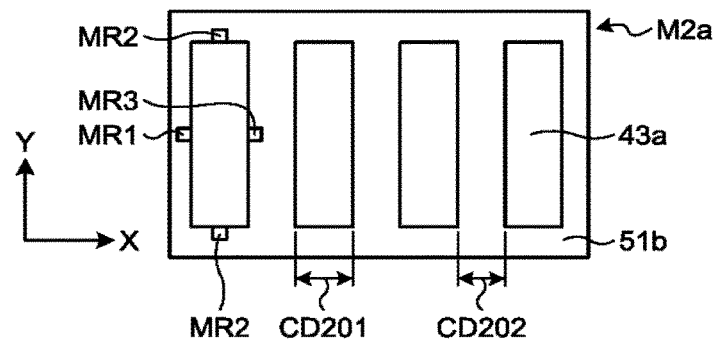
Figure 11C:
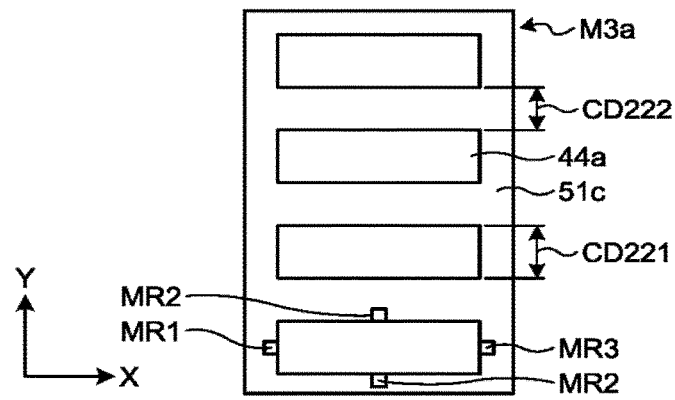

FIGS. 11A to 11C are diagrams illustrating an example of marks. FIG. 11A is a diagram illustrating an example of an overlay measurement mark. FIGS. 11B and 11C are diagrams illustrating an example of alignment marks. FIG. 11A illustrates an overlay measurement mark M1a, which is arranged in each of the regions R1. The overlay measurement mark M1a has a configuration in which a pair of line patterns 41a extending in the Y-direction are combined with a pair of line patterns 42a extending in the X-direction. The width of each of the line patterns 41a extending in the Y-direction is expressed by CD301. The distance between the line patterns 41a mutually adjacent in the Y-direction is expressed by CD302. The width of each of the line patterns 42a extending in the X-direction is expressed by CD221.

FIG. 11B illustrates an alignment mark M2a, which is arranged in the region R2. The alignment mark M2a has a configuration in which a plurality of line patterns 43a extending in the Y-direction are arrayed at predetermined intervals in the K-direction. The width of each of the line patterns 43a is expressed by CD201. The distance between the line patterns 43a mutually adjacent in the X-direction is expressed by CD202.

FIG. 11C illustrates an alignment shark M3a, which is arranged in the region R3. The alignment mark M3a has a configuration in which a plurality of line patterns 44a extending in the X-direction are arrayed at predetermined intervals in the Y-direction. The width of each of the line patterns 44a is expressed by CD221. The distance between the line patterns 44a mutually adjacent in the Y-direction is expressed by CD222.

In this embodiment, the marks in the mark arrangement region $R_M$ are formed by using patterns in common with the device formation patterns 21a to 21c in each pattern arrangement region $R_P$. Specifically, the line patterns 41a to 44a are formed of a light-shading film or absorbing film not provided with hole patterns. On the other hand, peripheral patterns 51a to 51c, which constitute the part other than line patterns, are formed of a light-shading film or absorbing film provided with hole patterns.

Figure 12A:
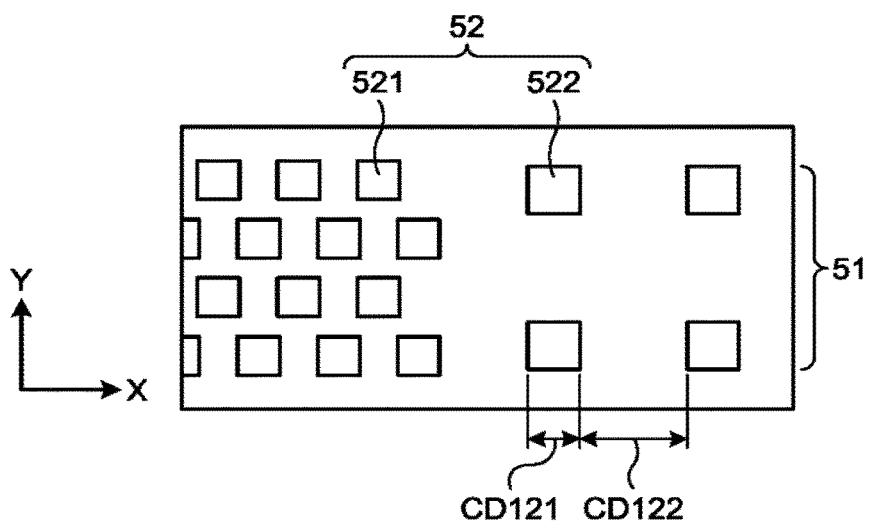
FIGS. 12A to 12C are diagrams illustrating an example of patterns constituting marks.
Figure 12B:
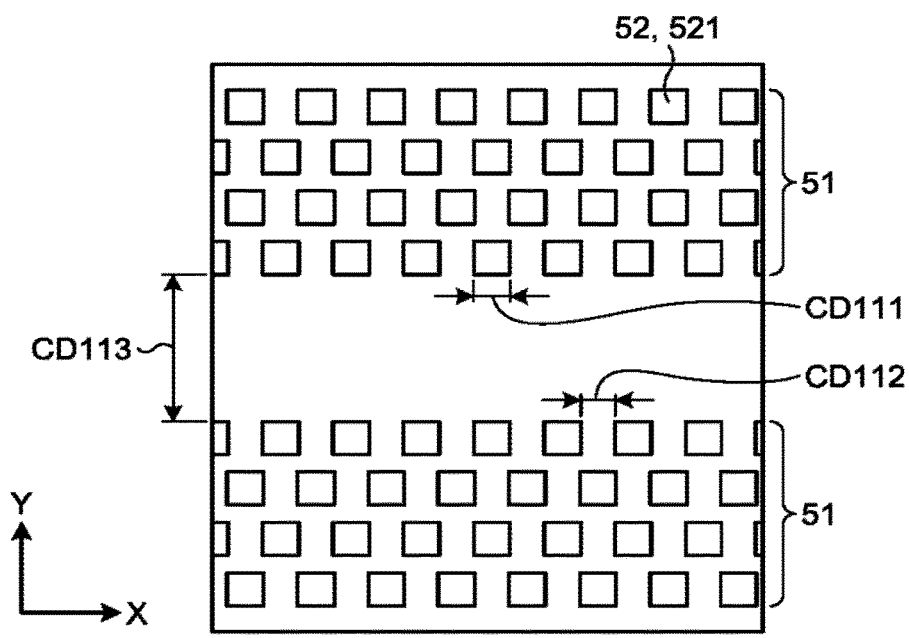
Figure 12C:
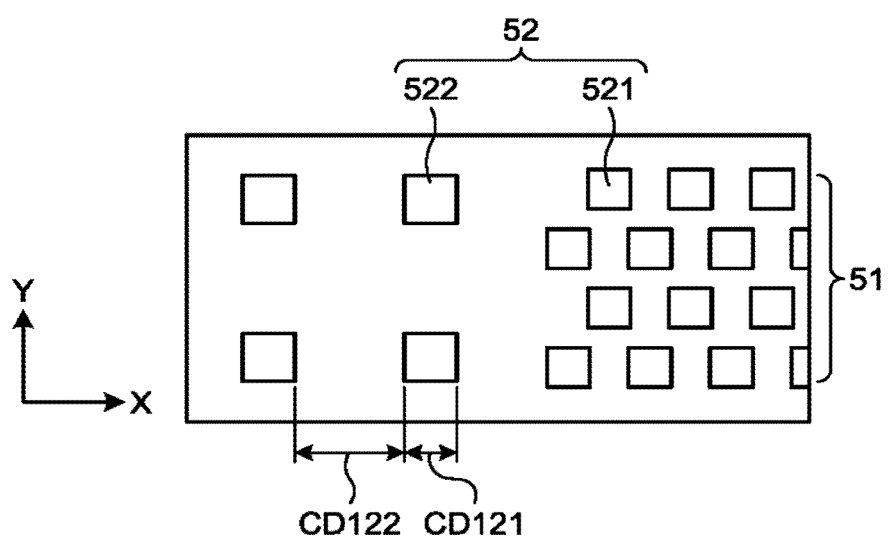

FIGS. 12A to 12C are diagrams illustrating an example of patterns constituting marks. FIG. 12A is a diagram illustrating an example of patterns at a position adjacent to each line pattern at one end in the X-direction. FIG. 12B is a diagram illustrating an example of patterns at a position adjacent to each line pattern at one end in the Y-direction. FIG. 12C is a diagram illustrating an example of patterns at a position adjacent to each line pattern at the other end in the X-direction. Here, FIG. 12A illustrates patterns in each region MR1 of FIGS. 11A to 11C. FIG. 12B illustrates patterns in each region MR2 of FIGS. 11A to 11C. FIG. 12C illustrates patterns in each region MR3 of FIGS. 11A to 11C.

As illustrated in FIG. 12B, around the line patterns 41a to 44a, the part other than the part near the ends of the line patterns 41a to 44a in the X-direction has a configuration in which line patterns 51 extending X-direction are arranged at predetermined intervals in a Y-direction. In other words, a line-and-space pattern is arranged here. Each of the line patterns 51 is composed of a plurality of components 52 having a size smaller than that of the line patterns 51. In this example, the components 52 are a plurality of hole patterns 521 constituting a hole, and the hole patterns 521 are arranged in a zigzag lattice-like state. A light-shading film or absorbing film is present in the part between the line patterns 51 mutually adjacent in the Y-direction. Further, the light-shading film or absorbing film is present in the part around the hole patterns 521 inside the line patterns 51.

The size of each of the hole patterns 521 in the K-direction is expressed by CD111. The distance between the hole patterns 521 mutually adjacent in the K-direction is expressed by CD112. Further, the distance between the line patterns 51 mutually adjacent in the Y-direction is expressed by CD113.

Further, as illustrated in FIGS. 12A and 12C, each of the line patterns 51 includes hole patterns 521 and auxiliary hole patterns 522 as components 52. The auxiliary hole patterns 522 are formed near the line patterns 41a to 44a. The auxiliary hole patterns 522 are arranged in a tetragonal lattice-like state, for example. The size of each of the auxiliary hole patterns 522 in the X-direction is expressed by CD121. The distance between the auxiliary hole patterns 522 mutually adjacent in the X-direction is expressed by CD122. For example, CD121 may be set larger than CD111. Further, CD122 is set larger than CD112.

As described above, the line patterns 51 have a structure the same as that of the line patterns 27 arranged in each pattern arrangement region $R_P$. Further, the hole patterns 521 and 522 have sizes the came as those of the hole patterns 251 and 252 arranged in each pattern arrangement region $R_P$.

Figure 3A:
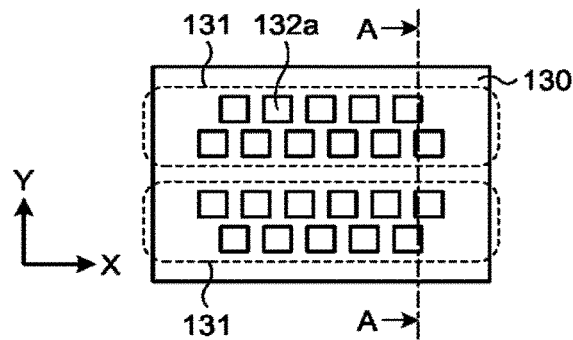
FIGS. 3A to 3H are partial top views schematically illustrating the example of the sequence of a semiconductor device manufacturing method in a device region according to the embodiment.

In the light exposure process of step S11, a reticle 20 including the patterns illustrated in FIGS. 10A to 10C and 12A to 12C is used. As illustrated in FIG. 3A, in each device region $R_D$ viewed from a macro perspective, line patterns 131 extending in the X-direction are arranged at predetermined intervals in the Y-direction. Further, as illustrated in FIGS. 3A and 4A, each of the line patterns 131 is composed of a plurality of hole patterns 132a. Also in each kerf region $R_K$, as in the device region $R_D$, line patterns, each of which is composed of a plurality of hole patterns aggregative therein, are arranged.

Figure 5A:
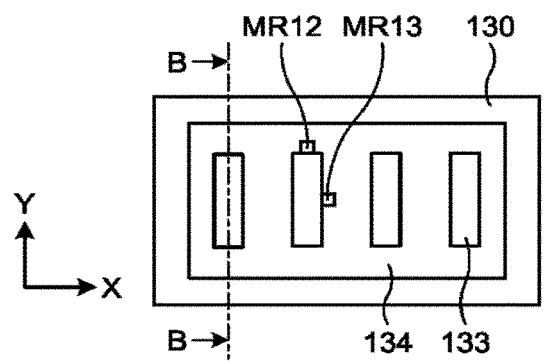
FIGS. 5A to 5H are partial top views schematically illustrating the example of the sequence of a semiconductor device manufacturing method at mark arrangement positions in a kerf region according to the embodiment.
Figure 5B:
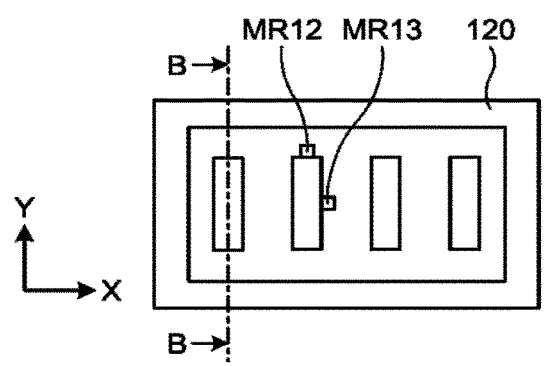
Figure 5C:
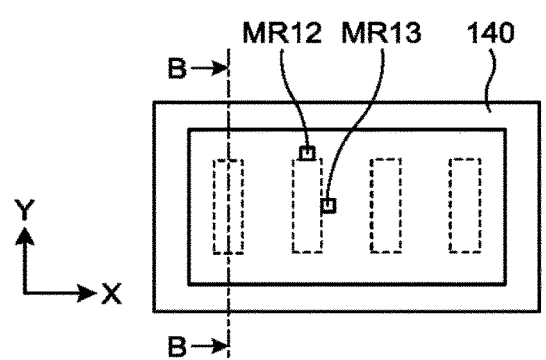
Figure 5D:
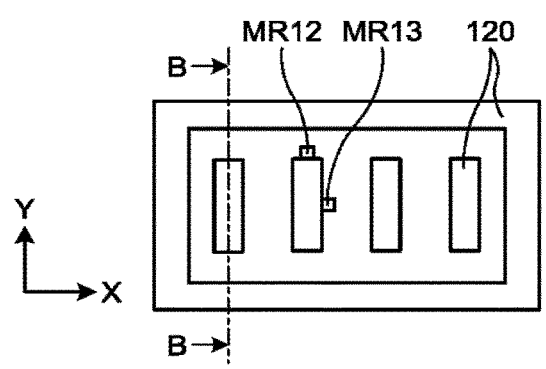
Figure 7A:
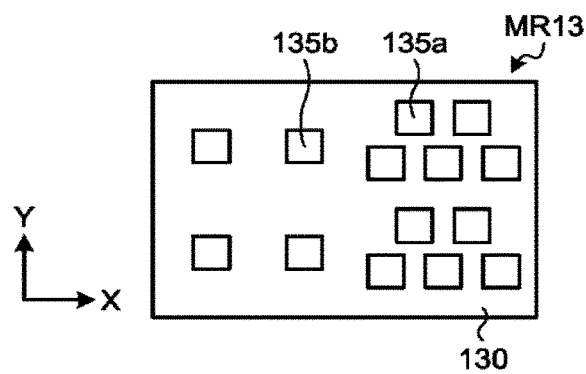
FIGS. 7A to 7H are enlarged top views illustrating a region MR13 of FIGS. 5A to 5H.

FIG. 5A illustrates a mark as a whole, and illustrates line patterns 133 and a peripheral pattern 134 formed in the part other than the line patterns 133. The line patterns 133 are not provided with hole patterns, but the peripheral pattern 134 is provided with hole patterns in fact, although not illustrated in FIG. 5A. FIG. 6A illustrates a portion corresponding to the region MR12 of FIG. 5A in an enlarged state. FIG. 7A illustrates a portion corresponding to the region MR13 of FIG. 5A in an enlarged state.

As illustrated in FIG. 6A, in the peripheral pattern 134 of FIG. 5A, the region MR12 other than the part near the ends of each line pattern 133 in the X-direction is provided with a line-and-space pattern, which is composed of a plurality of hole patterns 135a. Further, as illustrated in FIG. 7A, in the peripheral pattern 134 of FIG. 5A, the region MR13 near the ends of each line pattern 133 in the X-direction is provided with line patterns, each of which is composed of hole patterns 135a and auxiliary hole patterns 135b. The auxiliary hole patterns 135b are formed near the line patterns 133.

The boundary between each line pattern 133 and the peripheral pattern 134 in the resist pattern 130 formed here is a portion to serve as a mark edge.

Figure 3B:
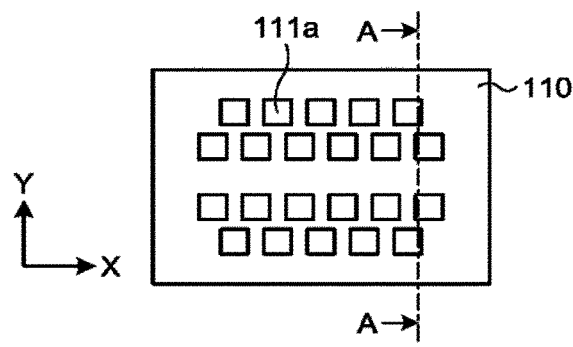
Figure 3C:
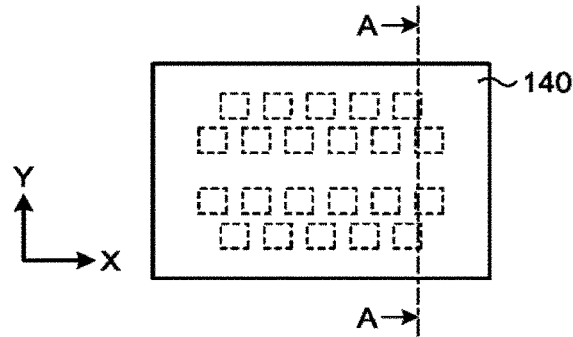
Figure 3D:
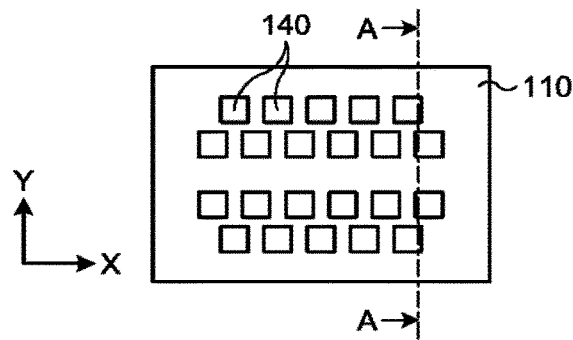
Figure 3E:
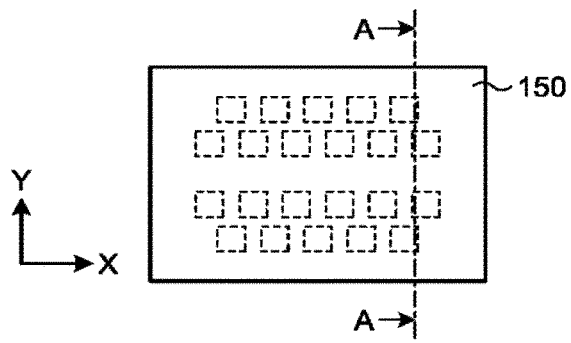
Figure 3F:
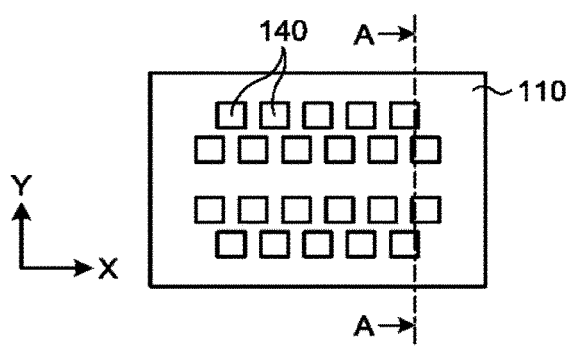
Figure 3G:
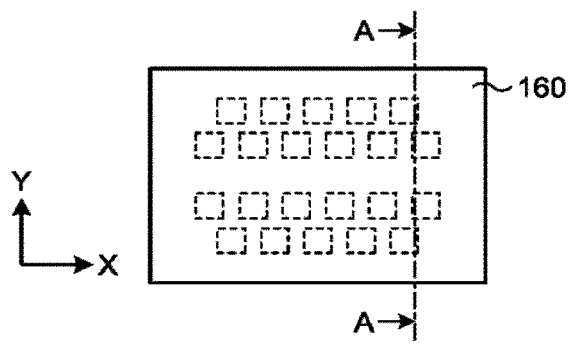
Figure 3H:
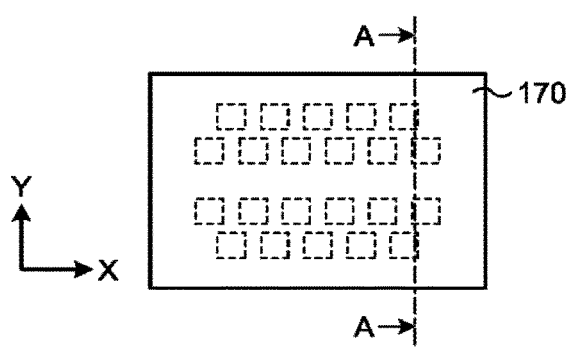
Figure 4B:
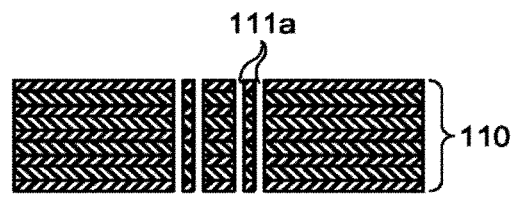
Figure 4C:
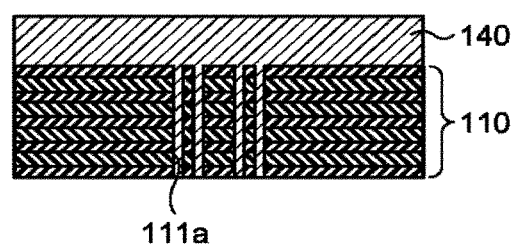
Figure 4D:
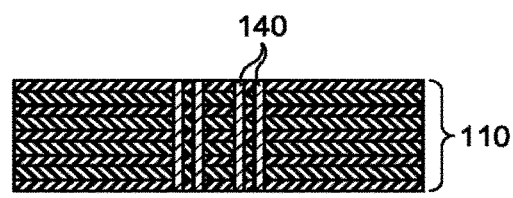
Figure 4E:
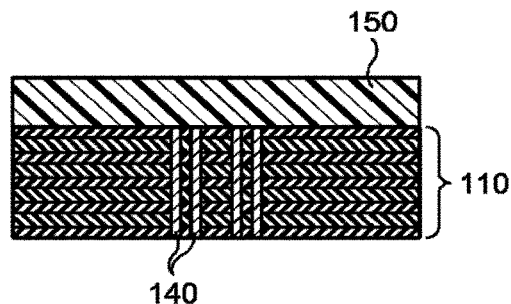
Figure 4F:
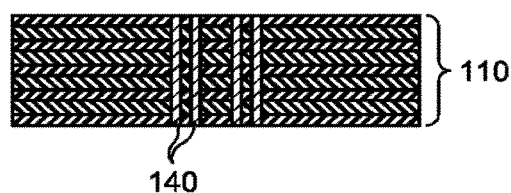
Figure 4G:
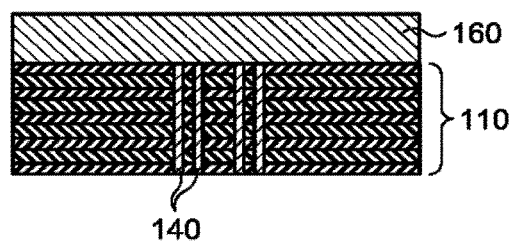
Figure 4H:
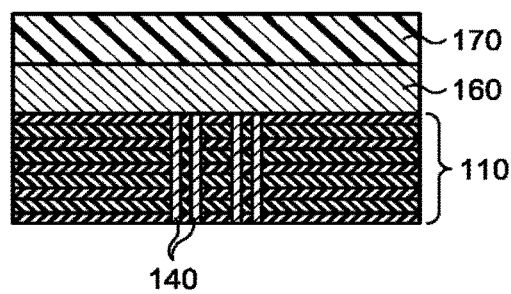
Figure 6B:
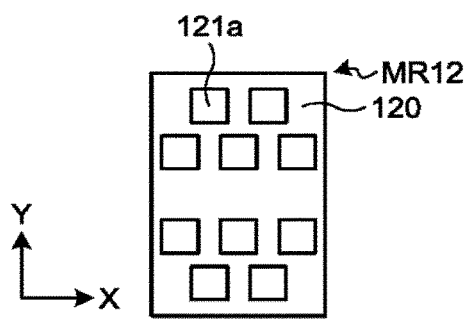
Figure 6C:
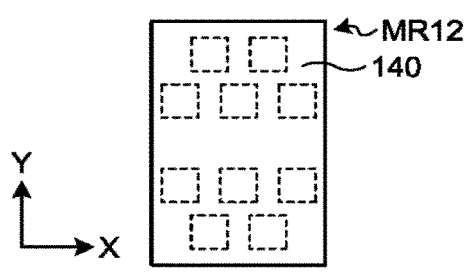
Figure 6D:
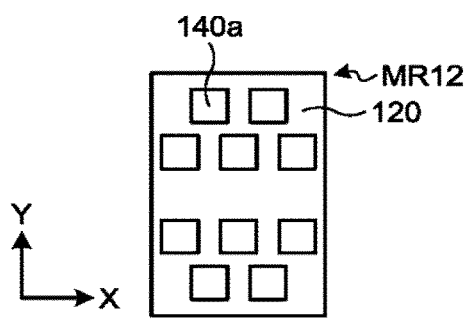
Figure 7B:
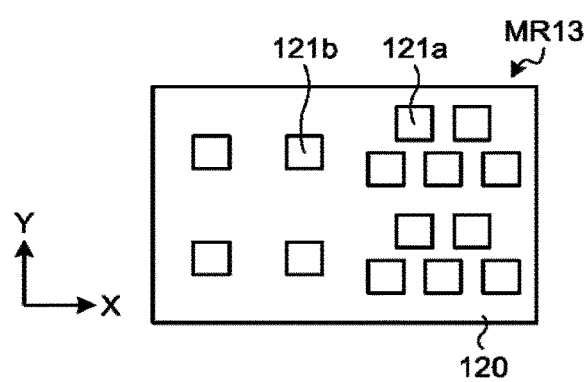
Figure 7C:
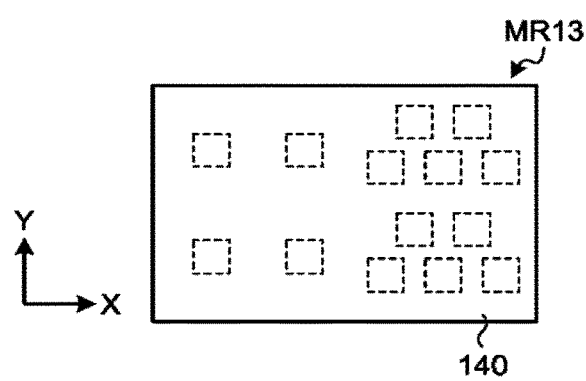
Figure 7D:
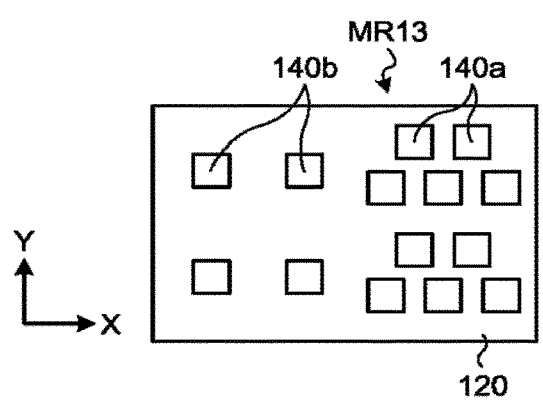
Figure 8B:
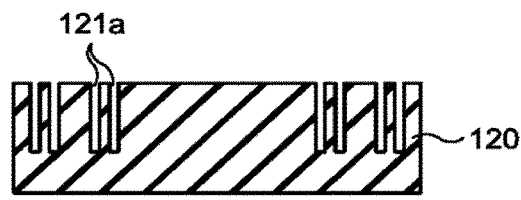
Figure 8C:
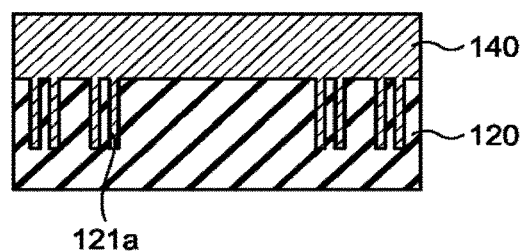
Figure 8D:
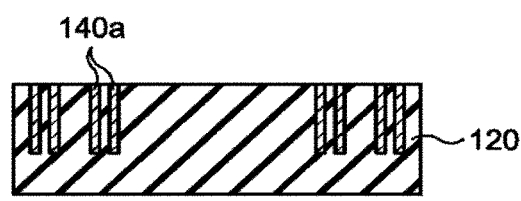
Figure 8E:
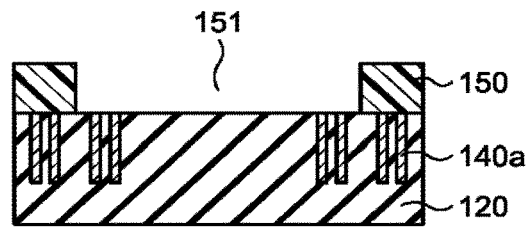

Then, a working process for forming the mark edges is performed (step S12). Specifically, as illustrated in FIGS. 3B, 4B, 5B, 6B, 7B, and 8B, the resist pattern 130 thus formed is used to work the processing target films 110 and 120 by anisotropic etching, such as Reactive Ion Etching (RIE). As illustrated in FIGS. 3B and 4B, holes 111a penetrating the stacked body treated as the processing target film 110 in the thickness direction are formed in each device region $R_D$. The holes 111a formed in the device region $R_D$ are to be used as memory holes. Further, as illustrated in FIGS. 6B, 7B, and 8B, holes 121a and auxiliary holes 121b are formed also in the processing target film 120 in each kerf region $R_K$. The holes 121a are formed at the positions corresponding to the hole patterns 135a, and the auxiliary holes 121b are formed at the positions corresponding to the auxiliary hole patterns 135b.

Thereafter, as illustrated in FIGS. 3C, 4C, 5C, 6C, 7C, and 8C, a pillar film 140 is formed on the upper surfaces of the processing target films 110 and 120 to fill the holes 111a, 121a, and 121b formed in the processing target films 110 and 120 (step S13). The pillar film 140 is preferably made of a material that provides a sufficient selective ratio relative to the processing target film 120 when the processing target film 120 is etched by a subsequent process. For example, the pillar film 140 is formed of a poly-silicon film. Here, in each device region $R_D$, before the pillar film 140 is formed, a memory film (not illustrated) is formed along the inner surface of each hole 111a, and then the pillar film 140 is formed to fill each hole 111a provided with the memory film. The memory film is formed such that a block insulating film, a charge accumulation film, and a tunnel insulating film are stacked from the inner surface side of each hole 111a, for example.

Then, as illustrated in 3D, 4D, 5D, 6D, 7D, and 8D, the portions of the pillar film 140 deposited on processing target films 110 and 120 are removed, and the upper surfaces of the processing target films 110 and 120 are planarized (step S14). For example, a Chemical Mechanical Polishing (CMP) method is used to planarize and remove the part of the pillar film 140 present above the upper surfaces of the processing target films 110 and 120. Further, in place of the CMP method, anisotropic etching, such as an RIE method, may be used to etch back the pillar film 140. Consequently, pillar films 140 are formed in the respective holes 111a of each device region $R_D$, pillar films 140a are formed in the respective holes 121a of each kerf region $R_K$, and auxiliary pillar films 140b are formed in the respective auxiliary holes 121b of each kerf region $R_K$.

Thereafter, a lithography process for forming mark stepped portions is performed (step S15). Specifically, a resist is applied onto the processing target films 110 and 120. Then, as illustrated in FIGS. 4E, 5E, 6E, 7E, and 8E, the resist is subjected to light exposure and then to development, so that a resist pattern 150 is formed on the processing target films 110 and 120. The resist pattern 150 includes openings 151 at the part of each kerf region $R_K$ where respective mark stepped portions (recessed areas) are to be formed.

Figure 13:
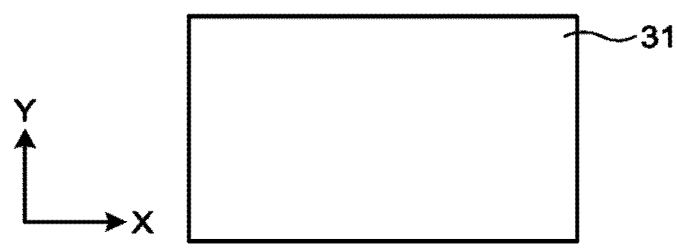
FIG. 13 is a diagram illustrating an example of a device formation pattern of a reticle.

FIG. 13 is a diagram illustrating an example of a device formation pattern of a reticle. All over each pattern arrangement region $R_P$ (regions PR1, PR2, and PR3) of FIG. 9, the device formation pattern 31 illustrated in FIG. 13 is arranged. Specifically, a light-shading film or absorbing film is provided all over each pattern arrangement region $R_P$ of a reticle 20 used in this step S15. Accordingly, in each device region $R_D$ of the semiconductor wafer, no pattern is formed by this light exposure process. In other words, each device region $R_D$ is in a state covered with the resist pattern 150.

Figure 14A:
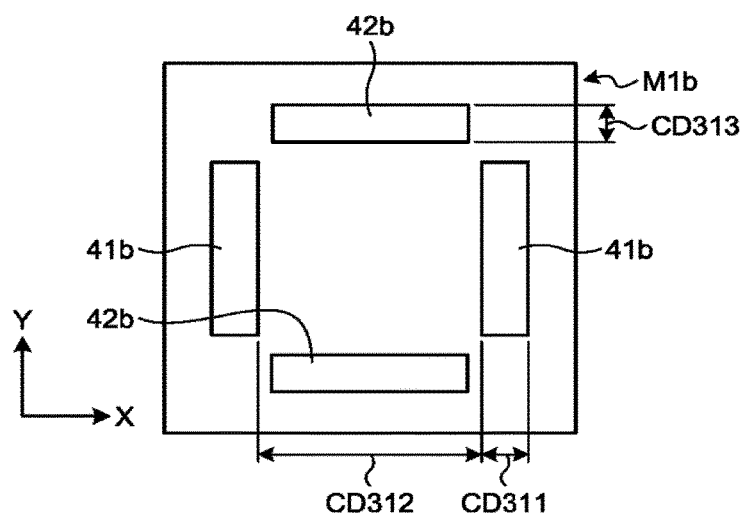
FIGS. 14A to 14C are diagrams illustrating an example of marks.
Figure 14B:
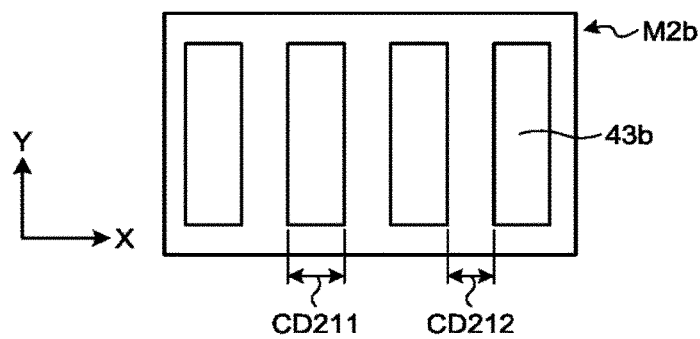
Figure 14C:
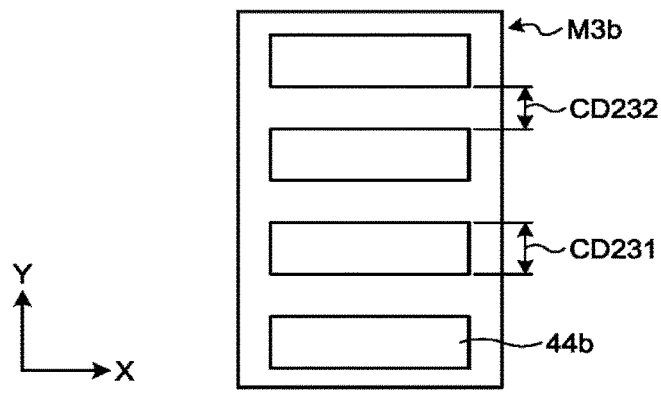

FIGS. 14A to 14C are diagrams illustrating an example of marks. FIG. 14A is a diagram illustrating an example of an overlay measurement mark. FIGS. 14B and 14C are diagrams illustrating an example of alignment marks. FIG. 14A illustrates an overlay measurement mark M1b, which is arranged in each of the regions R1 of the reticle 20 illustrated in FIG. 9. The overlay measurement mark M1b has a configuration in which a pair of line patterns 41b extending in the Y-direction are combined with a pair of line patterns 42b extending in the X-direction. The width of each of the line patterns 41b extending in the Y-direction is expressed by CD311. The distance between the line patterns 41b mutually adjacent in the Y-direction is expressed by CD312. The width of each of the line patterns 42b extending in the X-direction is expressed by CD313. Here, the width CD311 of each line pattern 41b has a value obtained by adding the distance CD122 between the auxiliary hole patterns 522 mutually adjacent in the X-direction, which is illustrated in FIGS. 12A and 12C, to the width CD301 of each line pattern 41a extending in the Y-direction, which is illustrated in FIG. 11A. Accordingly, the following formula (1) is satisfied.

$$CD311 = CD301 + CD122 \quad (1)$$

Figure 5E:
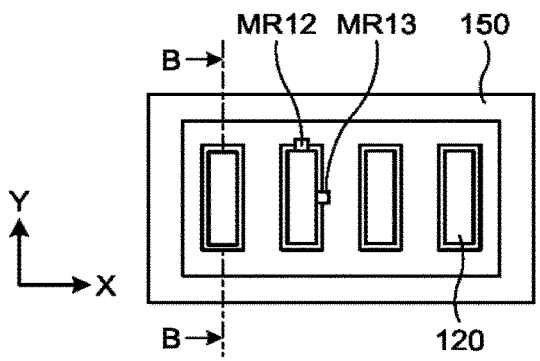
Figure 5F:
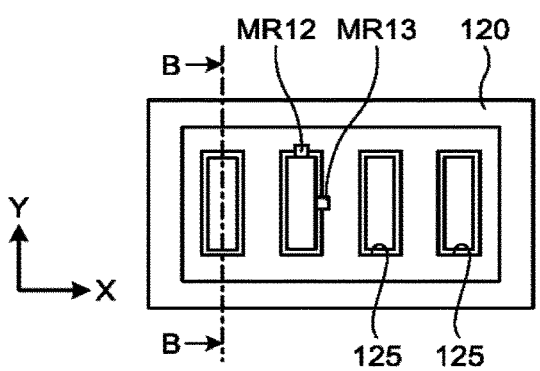
Figure 5G:
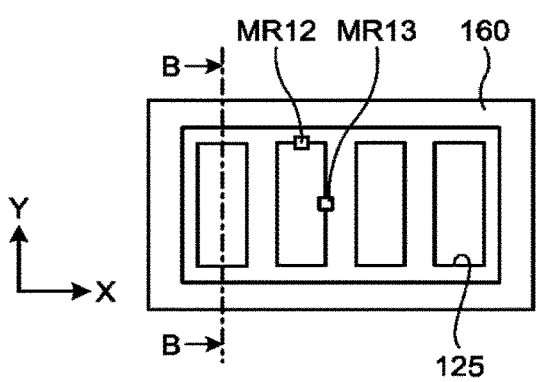
Figure 5H:
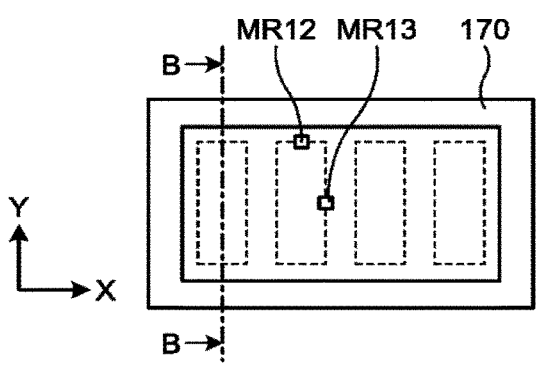
Figure 7E:
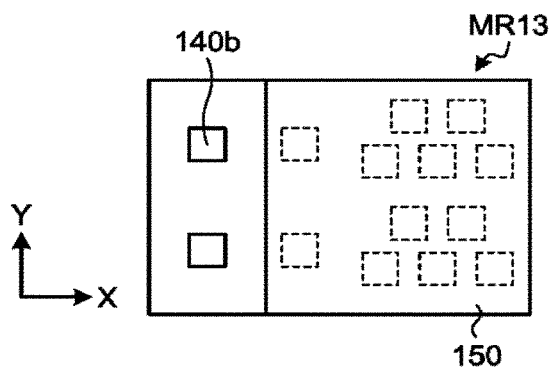
Figure 7F:
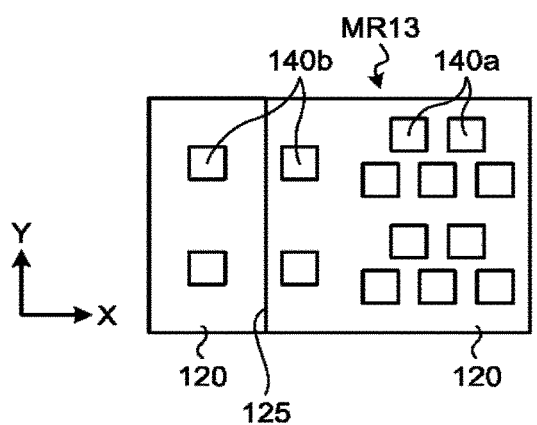
Figure 7G:
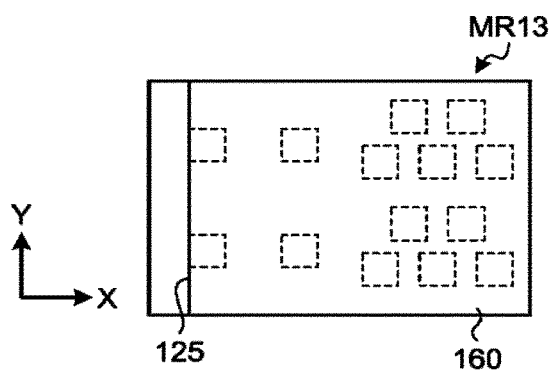
Figure 7H:
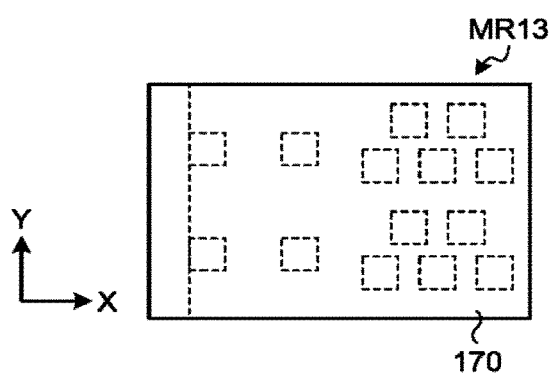

The line patterns 41b extending in the Y-direction of the overlay measurement mark M1b are formed to satisfy the formula (1). Consequently, as illustrated in FIGS. 5E and 7E, at least one row of auxiliary pillar films 140b comes to be exposed along a side perpendicular to the X-direction of each line pattern transferred onto the processing target film 120.

Further, the width CD313 of each line pattern 42b has a value obtained by adding the distance CD113 between the line patterns 51, which is illustrated in FIG. 12B, to the width CD221 of each line pattern 42a extending in the X-direction, which is illustrated in FIG. 11A. Accordingly, the following formula (2) is satisfied.

$$CD313 = CD221 + CD113 \quad (2)$$

Figure 6E:
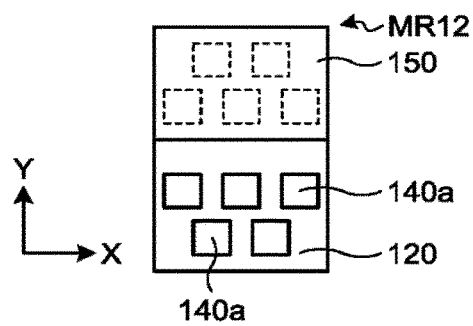
Figure 6F:
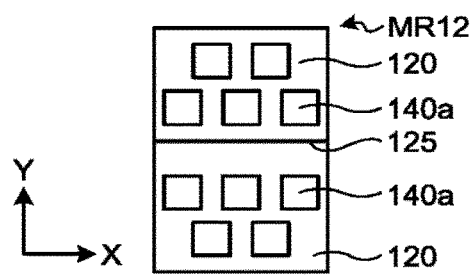
Figure 6G:
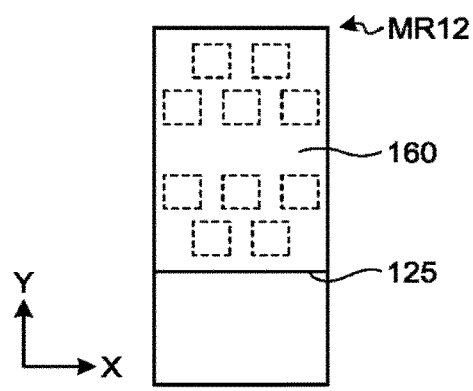
Figure 6H:
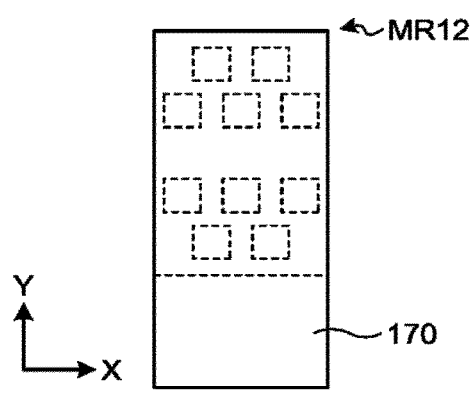

The line patterns 42b extending in the X-direction of the overlay measurement mark M1b are formed to satisfy the formula (2). Consequently, as illustrated in FIG. 6E, at least one row of pillar films 140a comes to be exposed along a side perpendicular to the Y-direction of each line pattern transferred onto the processing target film 120.

FIG. 14B illustrates an alignment mark M2b, which is arranged in the region R2 of the reticle 20 illustrated in FIG. 9. The alignment mark M2b has a configuration in which a plurality of line patterns 43b extending in the Y-direction are arrayed at predetermined intervals in the X-direction. The width of each of the line patterns 43b is expressed by CD211. The distance between the line patterns 43b mutually adjacent in the X-direction is expressed by CD212. Here, the width CD211 of each line pattern 43b has a value obtained by adding the distance CD122 between the auxiliary hole patterns 522 mutually adjacent in the X-direction, which is illustrated in FIGS. 12A and 12C, to the width CD201 of each line pattern 43a extending in the X-direction, which is illustrated in FIG. 11B. Accordingly, the following formula (3) is satisfied.

$$CD211 = CD201 + CD122 \quad (3)$$

The line patterns 43b extending in the Y-direction of the alignment mark M2b are formed to satisfy the formula (3). Consequently, as illustrated in FIGS. 5E and 7E, at least one row of auxiliary pillar films 140b comes to be exposed along a side perpendicular to the X-direction of each line pattern transferred onto the processing target film 120.

FIG. 14C illustrates an alignment mark M3b, which is arranged in the region R3. The alignment mark M3b has a configuration in which a plurality of line patterns 44b extending in the X-direction are arrayed at predetermined intervals in the Y-direction. The width of each of the line patterns 44b is expressed by CD231. The distance between the line patterns 44b mutually adjacent in the Y-direction is expressed by CD232. Here, the width CD231 of each line pattern 44b has a value obtained by adding the distance CD113 between the line patterns 51, which is illustrated in FIG. 12B, to the width CD221 of each line pattern extending in the Y-direction, which is illustrated in FIG. 11C. Accordingly, the following formula (4) is satisfied.

$$CD231 = CD221 + CD113 \quad (4)$$

The line patterns 44b extending in the X-direction of the alignment mark M3b are formed to satisfy the formula (4). Consequently, as illustrated in FIG. 5E, at least one row of pillar films 140a comes to be exposed along a side perpendicular to the Y-direction of each line pattern transferred onto the processing target film 120. Here, the relations expressed by the formulas (1) to (4) concern the state on the reticle 20; however, substantially the same relations hold also for the patterns transferred onto the processing target films 110 and 120.

Then, a working process for forming the mark stepped portions is performed (step S16). Specifically, as illustrated in FIGS. 3F, 4F, 5F, 6F, 7F, and 8F, the processing target film 120 in each kerf region $R_K$ is etched, through the resist pattern 150 serving as a mask, by using anisotropic etching, such as the RIE method. At this time, the etching is performed under conditions in which the pillar films 140a and the auxiliary pillar films 140b are hardly etched as compared with the processing target film 120. Consequently, a recessed area (stepped portion) 125 is formed in each line pattern of the kerf region $R_K$. Here, in the recessed area 125, the pillar films 140a and the auxiliary pillar films 140b, which are columnar patterns, are exposed, and are arranged in a projecting state with respect to the processing target film 120.

As the resist pattern 150 is formed to satisfy the formulas (1) to (4), each mark comes into a state where the outermost hole patterns, which are in contact with the corresponding line pattern, of the hole patterns formed around the line pattern are exposed. In practice, depending on the performance about the dimensional accuracy and overlay accuracy of a light exposure apparatus used in the light exposure process of step S15, in the case of the alignment mark M2b, for example, the size CD211 of the mark formed in the resist pattern 150 is slightly deviated from the designed value. However, if the sum of them is not larger than CD122, there is no change of the region, where pillar films 140a and auxiliary pillar films 140b are embedded inside the mark pattern, which comes to be exposed by the working process of step S16. Also in the case of the overlay measurement mark M1b, if the deviations of the sizes CD311 and CD313 of the line patterns 41b and 42b from the designed values are not larger than CD122 and CD113, respectively, there is no change of the region, where pillar films 140a and auxiliary pillar films 140b are embedded inside the mark pattern, which comes to be exposed by step S16. Also in the case of the alignment mark M3b, if the deviation of the size CD231 of the line patterns 44b from the designed value is not larger than CD113, there is no change of the region, where pillar films 140a and auxiliary pillar films 140b are embedded inside the mark pattern, which comes to be exposed by step S16.

After the resist pattern 150 is removed, as illustrated in FIGS. 3G, 4G, 5C, 6G, 7G, and 8G, a mask film 160 is formed on the processing target films 110 and 120 (step S17). For example, the mask film 160 is formed of a film of metal, such as Al, Cu, or W. Further, the mask film 160 is preferably an opaque film. Consequently, in the marks in each kerf region $R_K$, the mask film 160 is formed to cover the side surface and bottom surface of each recessed area 125. Thus, in accordance with the shape of each recessed area 125, also the mask film 160 comes to include a recessed area 125 (stepped portion). The size of this recessed area 125 is almost the same as the size of each line pattern 133 formed in step S11, and can be optically monitored. Here, the mask film 160 is to serve as a mask for working the processing target film 110 in each device region $R_D$.

Then, a lithography process for working the processing target film 110 in each device region $R_D$ is performed (step S18). Specifically, a resist is applied onto the mask film 160. Thereafter, as illustrated in FIGS. 3H, 4H, 5H, 6H, 7H, and 8H, the resist is subjected to light exposure and then to development, so that a resist pattern 170 is formed on the processing target films 110 and 120. At this time, in a light exposure apparatus, the light exposure process is performed, while the edge portions of the recessed areas 125 are monitored to recognize the position of the wafer.

Figure 15:
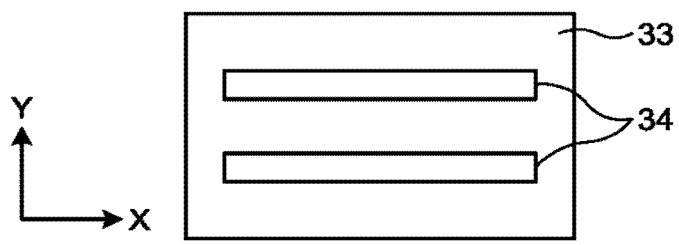
FIG. 15 is a diagram illustrating an example of a device formation pattern of a reticle.

FIG. 15 is a diagram illustrating an example of a device formation pattern of a reticle. All over each pattern arrangement region $R_P$ (regions PR1, PR2, and PR3) of FIG. 9, the device formation pattern 33 illustrated in FIG. 15 is arranged. Here, each pattern arrangement region $R_P$ of a reticle 20 is provided with a pattern in which line patterns 34 extending in the X-direction are arranged at predetermined intervals in the Y-direction.

Figure 16A:
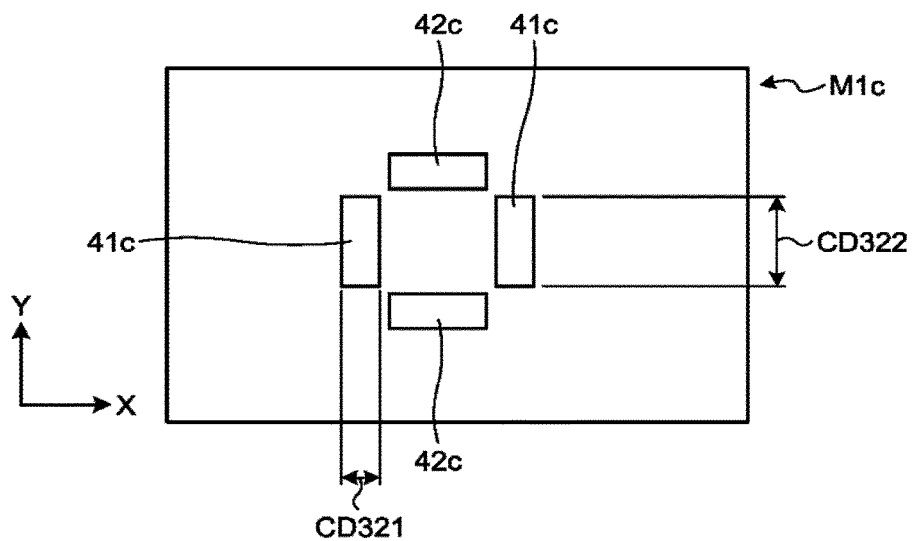
FIGS. 16A and 16B are diagrams illustrating an example of marks.
Figure 16B:
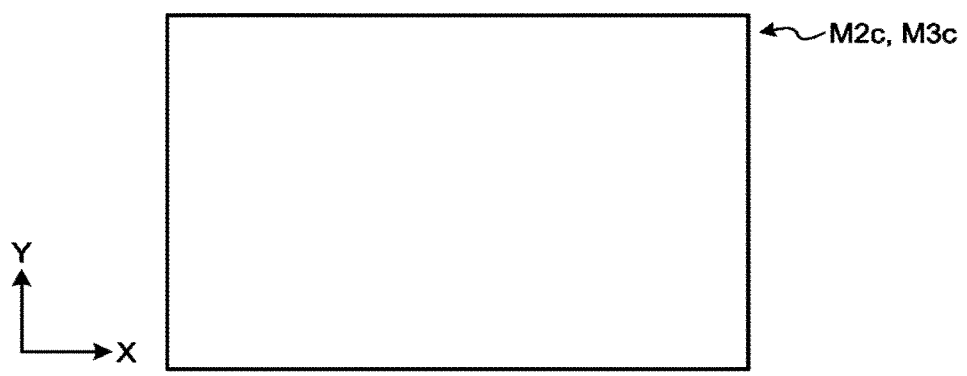

FIGS. 16A and 16B are diagrams illustrating an example of marks. FIG. 16A is a diagram illustrating an example of an overlay measurement mark. FIG. 16B is a diagram illustrating an example of alignment marks. FIG. 16A illustrates an overlay measurement mark M1c, which is arranged in each of the regions R1 of the reticle 20 illustrated in FIG. 9. The overlay measurement mark M1c has a configuration in which a pair of line patterns 41c extending in the Y-direction are combined with a pair of line patterns 42c extending in the X-direction. The width of each of the line patterns 41c extending in the Y-direction is expressed by CD321. The length of the line patterns 41c extending in the 1-direction is expressed by CD322.

Further, FIG. 16B illustrates alignment marks M2c and M3c, which are arranged in the regions R2 and R3 of the reticle 20 illustrated in FIG. 9, respectively. In the case of the alignment marks M2c and M3c, a light-shading film or absorbing film is provided all over the mark arrangement region $R_M$. Thus, no pattern is formed in each kerf region $R_K$ by this light exposure process.

The gravity center of the overlay measurement mark M1c is designed to agree with the gravity center of the overlay measurement mark M1a, in a case where the overlay error of step S18 is zero. Accordingly, after the process of step S18, in an overlay measurement apparatus (not illustrated), the gravity center distance between the overlay measurement mark M1c transferred onto the resist pattern 170 and the recessed areas 125 (stepped portions) formed on the mask film 160 are measured, so that an overlay error in step S18 is obtained. The overlay error thus obtained is used for checking the performance or performing feedback control, for step S18.

As described above, when the light exposure process of step S18 is performed, the edges of the recessed areas 125 formed in the mask film 160 serve for the overlay measurement mark M1c and the alignment marks M2c and M3c. This is because the mask film 160 is formed on the recessed areas 125, and stepped portions are thereby generated on the mask film 160. Then, overlay measurement or alignment is performed by utilizing the fact that the stepped portions of the mask film 160 can be recognized by optical monitoring.

Thereafter, the mask film 160 is etched by using the resist pattern 170. Further, the processing target film 110 is etched through the mask film 160 serving as a mask. As a result, the semiconductor device manufacturing method is completed. Each of the marks in each kerf region $R_K$ of the semiconductor wafer 10, manufactured as described above, includes the pattern illustrated in FIG. 8G.

Figure 8F:
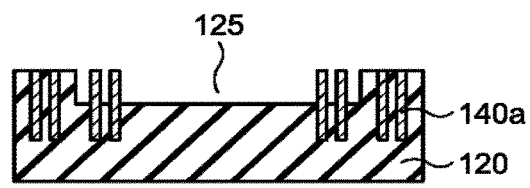
Figure 8G:
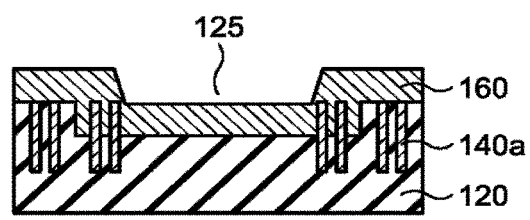
Figure 8H:
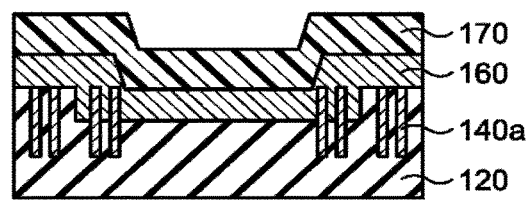

In the above description, as illustrated in FIG. 8F, the recessed area 125 is formed in each of the line patterns constituting a mark. However, the embodiment is not limited to this. For example, a recessed area may be formed at the peripheral side of each of the line patterns constituting a mark. In this case, hole patterns (pillar films and auxiliary pillar films) are formed inside the line patterns, but no hole pattern is formed in the peripheral pattern around the line patterns. Further, in the reticle 20 used in step S15 in this case, the widths CD311, CD313, CD211, and CD231 of the line patterns 41b to 44b of the mark arrangement region $R_M$ are expressed by the following formulas (5) to (8), which are different from the formulas (1) to (4). Here, the relations expressed by the formulas (5) to (8) concern the state on the reticle 20; however, substantially the same relations hold also for the patterns transferred onto the processing target films 110 and 120.

$$CD311 = CD301 - CD122 \quad (5)$$

$$CD313 = CD221 - CD113 \quad (6)$$

$$CD211 = CD201 - CD122 \quad (7)$$

$$CD231 = CD221 - CD113 \quad (8)$$

In the embodiment described above, a mark provided in each kerf region is formed by using hole patterns with a size and a period for hole patterns provided in each device region, which cannot be optically monitored. Further, the hole patterns are filled with pillar films, which provides a certain selective ratio relative to the processing target film present as an underlying layer. Further, a resist pattern is formed on an underlying film, such that one row of pillar films is included at a position adjacent, in the measurement direction of the mark, to each of the line patterns constituting the mark. Then, recessed areas are formed in the underlying film, under conditions in which the pillar films are not removed. Then, a mask film is formed on the underlying film. Consequently, recessed areas are formed also on the mask film, and stepped portions given by the recessed areas can be optically monitored, and thus can be utilized for the mark. In the case of a mark formed by using hole patterns that cannot be optically monitored as described above, the pattern size difference becomes smaller between the device formation pattern in each pattern arrangement region of the reticle and the mark in the mark arrangement region. As a result, it is possible to make smaller the overlay error due to the aberration of a light exposure apparatus, and thereby to improve the pattern overlay accuracy in each device region. Further, as the overlay accuracy is improved, it is possible to improve the product yield.

Further, the mark is formed by using hole patterns that cannot be optically monitored, but the resultant mark formed thereby is a mark that includes a structure of the stepped portions given by the recessed areas. Consequently, it is possible to optically monitor the mark.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor wafer comprising:
   a plurality of shot regions arranged therein, which include
      a device region arranging a semiconductor device, and
      a kerf region arranged around the device region and provided with a mark, the semiconductor device including a first pattern including first components, wherein
   the mark includes a first line pattern composed of a recessed area provided on a first film present as an underlying layer, a peripheral pattern constituting a region of the mark other than the first line pattern, and a second film covering the first line pattern and the peripheral pattern,
   the peripheral pattern is provided with the first components,
   the first components are pillar films and auxiliary pillar films,
   at least one row of the pillar films and the auxiliary pillar films as the first components is arranged along a contour of the recessed area, inside the contour of the recessed area,
   in the peripheral pattern, the pillar films and the auxiliary pillar films are embedded in the first film, and
   in the recessed area, the pillar films and the auxiliary pillar films are embedded in the first film and the second film covering the first film.

2. The semiconductor wafer according to claim 1, wherein the first components are columnar patterns.

3. A semiconductor wafer comprising:
   a plurality of shot regions arranged therein, which include
      a device region arranging a semiconductor device, and
      a kerf region arranged around the device region and provided with a mark, the semiconductor device including a first pattern including first components, wherein
   the mark includes a first line pattern composed of a first film present as an underlying layer, a peripheral pattern arranged at a recessed area provided on the first film in a region of the mark other than the first line pattern, and a second film covering the first line pattern and the peripheral pattern,
   the first line pattern is provided with the first components,
   the first components are pillar films and auxiliary pillar films,
   at least one row of the pillar films and the auxiliary pillar films as the first components is arranged along a contour of the first line pattern, inside a region of the recessed area in contact with the first line pattern,
   in the first line pattern, the pillar films and the auxiliary pillar films are embedded in the first film, and
   in the recessed area, the pillar films and the auxiliary pillar films are embedded in the first film and the second film covering the first film.

4. The semiconductor wafer according to claim 3, wherein the first components are columnar patterns.

* * * * *